United States Patent
Spikes et al.

(10) Patent No.: US 6,211,000 B1
(45) Date of Patent: *Apr. 3, 2001

(54) METHOD OF MAKING HIGH PERFORMANCE MOSFETS HAVING HIGH CONDUCTIVITY GATE CONDUCTORS

(75) Inventors: Thomas E. Spikes, Round Rock; Mark I. Gardner, Cedar Creek; H. Jim Fulford, Jr., Austin, all of TX (US)

(73) Assignee: Advanced Micro Devices, Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/225,158

(22) Filed: Jan. 4, 1999

(51) Int. Cl.[7] .................................. H01L 21/8238
(52) U.S. Cl. .................. 438/199; 438/197; 438/142; 438/660; 438/663; 438/664; 438/682; 438/586; 438/592; 257/199; 257/287
(58) Field of Search .................. 438/199, 197, 438/142, 660–664, 682, 586, 592; 257/199, 287

(56) References Cited

U.S. PATENT DOCUMENTS

| | | | |
|---|---|---|---|
| 4,935,380 | * | 6/1990 | Okumura ........................ 437/44 |
| 4,963,504 | * | 10/1990 | Huang ............................ 437/44 |
| 5,164,333 | * | 11/1992 | Schwalke et al. ............... 437/200 |
| 5,447,875 | * | 9/1995 | Moslehi .......................... 437/41 |
| 5,625,217 | * | 4/1997 | Chau et al. ...................... 257/412 |
| 5,874,343 | * | 2/1999 | Fulford et al. .................. 438/305 |
| 5,924,011 | * | 7/1999 | Huang ............................ 438/655 |
| 5,949,092 | * | 9/1999 | Kadosh et al. .................. 257/67 |
| 5,953,612 | * | 9/1999 | Lin et al. ........................ 438/299 |
| 5,963,803 | * | 10/1999 | Dawson .......................... 438/231 |
| 5,981,383 | * | 11/1999 | Lur et al. ........................ 438/655 |
| 6,011,289 | * | 1/2000 | Huang et al. ................... 257/321 |
| 6,117,755 | * | 9/2000 | Kun-Yu et al. .................. 438/592 |

* cited by examiner

Primary Examiner—Matthew Smith
Assistant Examiner—Grarril D. Lee, Jr.
(74) Attorney, Agent, or Firm—Bruce E. Garlick; James A. Harrison

(57) ABSTRACT

A method of fabricating an integrated circuit includes forming a gate stack upon an active region of a substrate which includes a gate dielectric, a polysilicon gate conductor and a polysilicon consumption metal layer portion. The polysilicon consumption metal layer portion is then reacted with the polysilicon gate conductor to form a high conductivity gate conductor (silicide). In one embodiment, the polysilicon gate conductor is fully consumed. In another embodiment, the polysilicon gate conductor is substantially consumed but a portion of the polysilicon gate conductor adjacent the gate dielectric remains. In forming such a gate structure, a gate dielectric layer is first formed and a polysilicon gate layer is formed upon the gate dielectric layer. A polysilicon consumption metal layer is then formed upon the polysilicon gate layer. The surface is then patterned mask so that the location of the gate structures is protected. The substrate is then anisotropically etched to form the gate structures. At this point, an optional rapid thermal annealing step may be performed to partially react the polysilicon consumption metal layer portion with the polysilicon gate conductor. Spacers, lightly doped drain regions and source and drain regions are then formed. Next, a silicidation metal layer is formed and the structure is reacted in a rapid thermal annealing step to form silicidation layers in the source and drain regions and to complete reaction of the polysilicon consumption metal layer portion with the gate conductor. Subsequently, the transistors may be interconnected to form an integrated circuit.

16 Claims, 5 Drawing Sheets

METHOD OF MAKING HIGH PERFORMANCE MOSFETS HAVING HIGH CONDUCTIVITY GATE CONDUCTORS

BACKGROUND

1. Field of the Invention

The present invention relates generally to integrated circuit manufacture and more particularly to a method and structure in which a MOSFET is formed that has a gate polysilicon that has been converted into a silicide and which possesses enhanced conductivity.

2. Description of the Related Art

The structure and the various components, or features, of a metal oxide semiconductor (MOS) devices are generally well known. A MOS transistor typically includes a substrate material onto which a gate dielectric and a patterned gate conductor are formed. The gate conductor causes the impurities forwarded into the substrate on opposite sides of the gate conductor to self-align. The impurities placed into the substrate define a junction region, also known as source and drain regions. The gate conductor is patterned from a layer of polysilicon using various lithography techniques.

A typical n-channel MOS transistor employs N-type junctions placed into a P-type substrate. Conversely, a typical p-channel MOS transistor comprises P-type junctions placed into an N-type substrate. The substrate comprises an entire monolithic silicon wafer, of which, a portion of the substrate known as a "well" exists. The well is doped opposite the substrate so that it can accommodate junctions of an impurity type opposite the junction in the non well areas. Accordingly, wells are often employed when both N-type and P-type transistors (i.e., Complementary MOS, "CMOS") are needed.

A common trend in modern integrated circuit manufacture is to produce transistors having feature sizes as small as possible. To form a high density integrated circuit, features such as the gate conductors, source and drain junctions, and interconnects to the junctions must be made as small as possible. Many modern day processes employ features which have as small as 0.20 microns critical dimensions. As feature sizes decrease, the size of the resulting transistors as well as the interconnections between transistors also decrease. Smaller transistor size allows more transistors to be placed on a single monolithic substrate, thereby allowing relatively large circuit systems to be incorporated on a single and relatively small die area. Further, smaller transistors typically have lower turn-on threshold voltages, faster switching speeds and consume less power in their operation. The combination of these features allow higher speed integrated circuits to be constructed. Additionally, these higher speed integrated circuits have greater processing capabilities and produce less heat.

The benefits of high-density integrated circuits can only be realized if advanced processing techniques are used. For example, semiconductor process engineers and researchers often study the benefits of electron beam lithography and x-ray lithography to achieve the higher resolutions needed for submicron features. To some extent, wet etch techniques are being replaced by more advanced anisotropic (dry etch) techniques. Further, silicides and polycides are replacing higher resistivity contact structures mostly due to the lower resistivity needed when a smaller contact area is encountered.

Many other techniques are often used to achieve a higher density circuit. However, these techniques must contend with problems resulting from higher density itself. Even the most advanced processing techniques cannot, in all instances, offset the problems associated with small features or features arranged extremely close to one another. For example, as the channel length decreases, short channel effects ("SCE") generally occur. SCE cause threshold voltage skews at the channel edges as well as excessive subthreshold currents (e.g., punch through and drain-induced barrier lowering). Related to SCE is the problem of hot carrier injection ("HCI"). As the channel shortens and the supply voltage remains constant, the electric field across the drain-to-channel junction becomes excessive. Excessive electric fields give rise to so called hot carriers and the injection of these carriers into the gate oxide which resides between the substrate (or well) and the overlying gate conductor. Injection of hot carriers should be avoided since these carriers can become trapped and skew the turn-on threshold voltage of the ensuing transistor. In view of these considerations, certain scaling limits are being reached.

There also are additional problems that exist when attempting to reduce the channel length in scaled transistors. When the channel length of a transistor is reduced, the cross-sectional area of the gate conductor is also reduced. Because high speed operation of devices depends, in part, upon the conductivity of the gate conductor, the reduction in cross-sectional area of the gate conductor harms device performance. Thus, there exists a need in the art for a method of forming devices that have gate conductors with enhanced conductivity.

SUMMARY OF THE INVENTION

The problems outlined above are in large part solved by transistors formed according to the present invention that include a gate with enhanced conductivity as compared to prior devices. In forming a gate conductor according to the present invention, a gate polysilicon/silicidation metal gate structure is first formed upon a gate dielectric. In a rapid thermal process, the silicidation metal is reacted with the gate polysilicon to convert a substantial portion, or all of, the gate polysilicon to a silicide. When converted to the silicide, the gate conductor has increased bulk conductivity which causes the gate conductor to have improved performance for high-speed switching.

During the rapid thermal annealing steps that convert the gate polysilicon to a silicide, silicidation of the source and drain junctions may also be performed. By combining such steps, an efficiency in the manufacturing process is achieved. However, the amount of silicidation formed in the source and drain implants must be limited so that the source and drain implants are not consumed in the silicidation step. In contrast, it is advantageous to consume all of the polysilicon material in a gate conductor stack. Accordingly, the invention includes forming an aggressive consumption metal on top of the polysilicon gate conductor stack that will, in either one or two annealing steps, consume all or a significant portion of the gate conductor layer. On the other hand, because an aggressive consumption metal would consume too much of the source and drain implants, a second silicidation metal is formed on top of the source and drain implants as well as on top of the aggressive consumption metal that is on top of the gate conductor layer. The second consumption metal is one that is a far less aggressive consumption metal, and therefore does not tend to consume excessive amounts of the source and drain implant regions or of the device junctions.

These and other aspects of the present invention will become apparent with further reference to the drawings and specification which follow.

BRIEF DESCRIPTION OF THE DRAWINGS

A better understanding of the present invention can be obtained when the following detailed description is considered in conjunction with the following drawings, in which.

DETAILED DESCRIPTION OF THE DRAWINGS

Figure 1A:
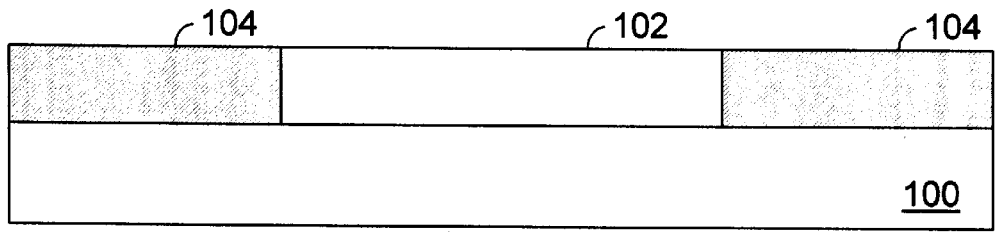
FIGS. 1A through 1D are partial cross-sectional views of a semiconductor substrate during the formation of transistors according to the present invention.

FIGS. 1A through 1D are partial cross-sectional views of a semiconductor substrate illustrating the formation of transistors according to the present invention. Referring now to FIG. 1A, a substrate 100 includes an active region 102 and a plurality of isolation regions 104. In general, FIG. 1A represents a substrate 100 after a first set of steps of the integrated circuit fabrication process as described herein are performed. The active region 102 is a semiconductive region in which an active device may be formed and is one of a number of active regions that are formed to create an integrated circuit. The isolation regions 104 are formed of an insulating material that serves to isolate active devices or conductive components from other active devices or conductive components. For silicon-based semiconductor circuits, the isolation regions 104 are typically formed of silicon dioxide. The isolation regions 104 may be formed using the well-known LOCOS growth process, trenching and filling steps or another isolation process. In general, the invention herein includes all forms of creating isolation regions 104.

Figure 1B:
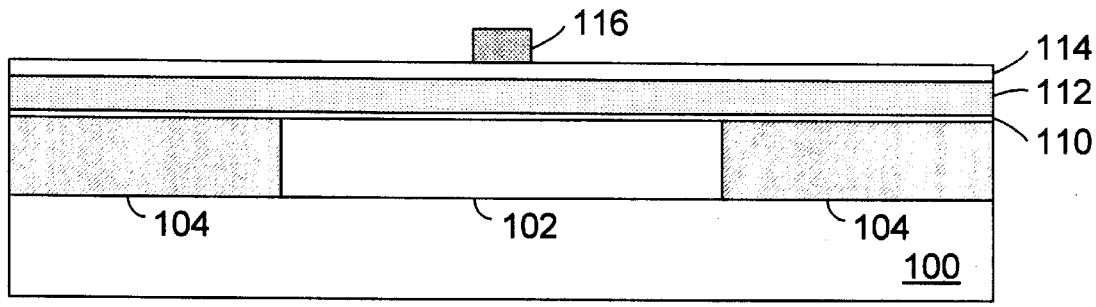

Referring now to FIG. 1B, a gate dielectric layer 110 is formed upon the surface of the substrate 100 (upon both the active region 102 and the isolation region 104). The gate dielectric layer 110 may be formed of silicon dioxide, a combination of silicon dioxide and another material or of another material. In any case, the gate dielectric layer 110 is formed to have an equivalent thickness of between 15 and 25 Angstroms of silicon dioxide.

In a particular embodiment, the gate dielectric layer 110 is formed of a high K material that is deposited on top of substrate 100. The high K material dielectric layer 110 may be formed of $Ta_2O_5$ or of Barium Strontium Titanate (BST), for example. The $Ta_2O_5$ has a K value that is equal to 25. The BST has a K value that is equal to 160. By way of example, the high K material dielectric layer 110 is deposited so as to have an effective thickness in the range that is equal to fifteen Angstroms to twenty-five Angstroms of silicon dioxide (K=4) If a $Ta_2O_5$ layer is deposited on substrate 100 as a high K material dielectric layer 110, it is formed to have a thickness of approximately [15*(25/4)=] 93.75 Angstroms to [25*(25/4)=] 156.25 Angstroms. Further, if BST is used instead of $Ta_2O_5$, the BST layer is formed to have a thickness equal to approximately [15*(160/4)=] 600 Angstroms to [25*(160/4)=] 1000 Angstroms.

Continuing to refer to FIG. 1B, it may be seen that a polysilicon gate conductor has been deposited upon the substrate 100 to form a polysilicon gate conductor layer 112. The Polysilicon gate conductor layer 112 is formed of a polysilicon that is doped upon its deposit. Alternatively, the polysilicon gate conductor layer 112 may be formed of undoped polysilicon. In the described embodiment of the invention, the polysilicon gate conductor layer 112 is deposited in a Low Pressure Chemical Vapor Deposition (LPCVD) step or in another step that is known in the art. In the described embodiment, polysilicon gate conductor layer 112 is formed to have a depth or thickness of approximately 1500 Angstroms.

Continuing to refer to FIG. 1B, it may be seen that a polysilicon consumption metal layer 114 has been deposited on top of the polysilicon gate conductor layer 112. The polysilicon consumption metal layer 114 may be deposited on top of substrate 100 in different types of processes that are known. In the described embodiment, the polysilicon consumption metal layer 114 is deposited in a chemical vapor deposition (CVD) step. Alternatively, however, polysilicon consumption metal layer 114 may be deposited either in a sputtering step or in a plasma deposition step.

In the described embodiment, polysilicon consumption metal layer 114 is formed to a thickness of 750 Angstroms and is formed of titanium. In an alternative embodiment, however, cobalt may be used. In general, it is desirable to use a metal that will actively consume polysilicon to form a silicide in a rapid thermal annealing (RTA) step. Cobalt and titanium are good choices in that they aggressively consume the polysilicon gate conductor in the step to form the silicide.

Continuing to refer to FIG. 1B, it may be seen that a patterned mask 116 is formed on top of polysilicon consumption metal layer 114 to define and protect a gate stack of the MOS transistor. The method of forming a patterned mask 116 is well known in the art. In general, however, a patterned mask 116 is formed over the device to shield the device or portions thereof while subsequent processing steps are performed. The patterned mask 116 is formed by depositing a photoresist across the exposed surface of the substrate. The portion of the substrate that is not to be protected is been exposed in a known photolithography step. Thereafter, be exposed portions of the photoresist are stripped away in an ashing process. The patterned mask 116 that results may also be formed using other known techniques.

Once the patterned mask 116 is formed, unprotected portions of the underlying layers are etched using one of many known etching techniques to expose the active region 102 and the isolation regions 104. In the described embodiment, an isotropic etch is performed to remove portions of the polysilicon consumption metal layer 114 (as discussed above), the polysilicon layer 112, and the dielectric layer 110 removed everywhere on the substrate 100 that they are unprotected by the patterned mask 116.

Figure 1C:
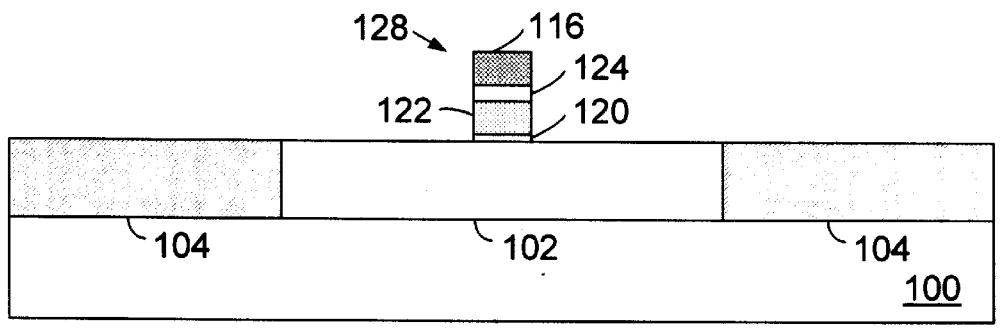

Referring now to FIG. 1C, the substrate 100 is shown after the isotropic etch has been performed. The remaining portions of the polysilicon consumption metal layer 114, polysilicon layer 112, and dielectric layer 110 are shown as gate dielectric 120, gate conductor 122, and polysilicon consumption metal layer portion 124, respectively, all of which reside below the patterned mask 116. These components together form a gate stack, referred to generally at 128.

While not shown specifically in FIG. 1C, the gate stack 128 may be altered in an optional RTA step that partially reacts polysilicon consumption metal layer portion 124 with polysilicon gate conductor 122 to convert a portion of the polysilicon gate conductor 122 to a silicide. The optional RTA step is performed by subjecting substrate 100 to a nitrogen environment at a temperature of 600 to 800 degrees Celsius for a period of 30 to 60 seconds. If the optional RTA step is performed, then the substrate 100 shown in FIG. 1C will include a partially reacted layer in which polysilicon consumption metal layer portion 124 and gate conductor 122 were combined, the reacted layer being formed between layers 122 and 124.

Figure 1D:
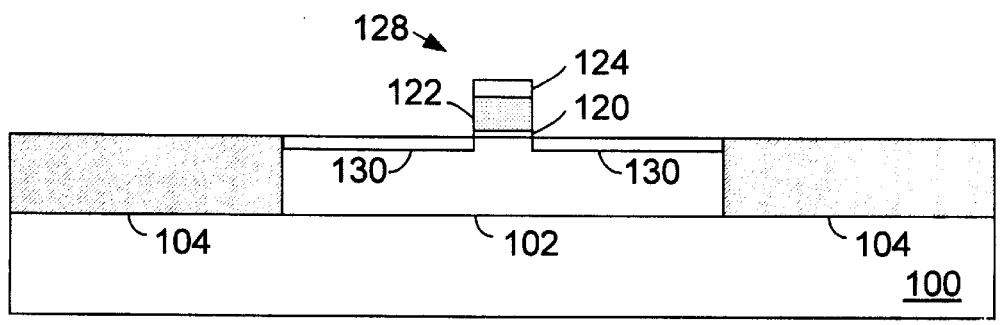

Referring now to FIG. 1D, substrate 100 is shown after the patterned mask 116 is stripped and an LDD implant 130 has been formed in the active region 102 of substrate 100 in an area unprotected by the gate stack 128. The formation of an LDD implant 130 is well known in the art to include lightly doping a top layer of a substrate active region 102. In another embodiment, the LDD implant 130 is formed prior to stripping the patterned mask 116.

Figure 2A:
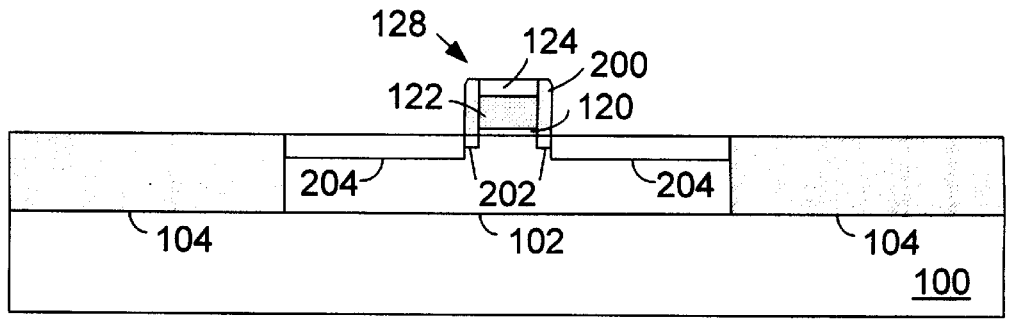
FIGS. 2A through 2D are additional partial cross-sectional views of the semiconductor substrate of FIGS. 1A through 1D during formation of transistors according to present invention.

FIGS. 2A through 2D are additional partial cross-sectional views of the semiconductor substrate of FIGS. 1A through 1D during formation of transistors according to present invention. Referring now to FIG. 2A, it may be seen that spacers 200 have been formed about the gate stack 128. Spacers 200 may be formed using standard processing steps, by way of example, a TEOS step. Other techniques for forming spacers, as known by those skilled in the art, may be used and are specifically incorporated herein for all purposes.

Continuing to refer to FIG. 2A, it may be seen the source and drain regions 204 have been implanted within active region 102 of substrate 100. Any one of several known techniques for implanting and for forming the source and drain regions 204 may be used and are specifically incorporated herein for all purposes. Additionally, as may be seen, the implantation of the dopant is performed at an energy level to only partially penetrate active region 102. Resultantly, the source and drain regions 204 are shallow and do not extend to the full depth of the active region 102 or to the depth of the isolation regions 104. Moreover, as may be seen, a channel is defined underneath the gate stack 128 as a result of the formed source and drain regions. The channel extends, in FIGS. 2A through 2D, to be the width of gate stack 128.

The dopant employed to form the source and drain regions 204 as well as the LDD regions 202 defined thereby depends upon the type of transistor being formed. For example, when forming an n-channel transistor, arsenic is employed to form the source and drain regions 204 and the LDD regions 202, the active region being p-type in such case. Alternatively, when forming a p-channel transistor, boron is employed to form the source and drain regions 204 and the LDD regions 202. Such doping techniques are generally known in the art as are applied herein and will not be discussed further.

Figure 2B:
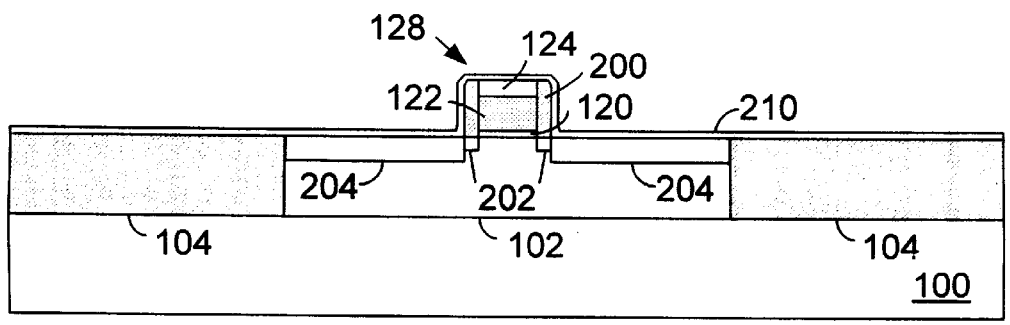

Referring now to FIG. 2B, it may be seen that a silicidation metal layer 210 has been formed on top of the surface of substrate 100. Any common method of forming metal layers including CVD, sputtering and plasma deposition may be used. In the described embodiment, nickel is preferred as a the silicidation metal because it less aggressively consumes the source and drain regions 204 during a subsequent reaction step, as compared to cobalt or titanium. In the described embodiment, silicidation metal layer 210 is formed to have a thickness of 100 Angstroms.

Figure 2C:
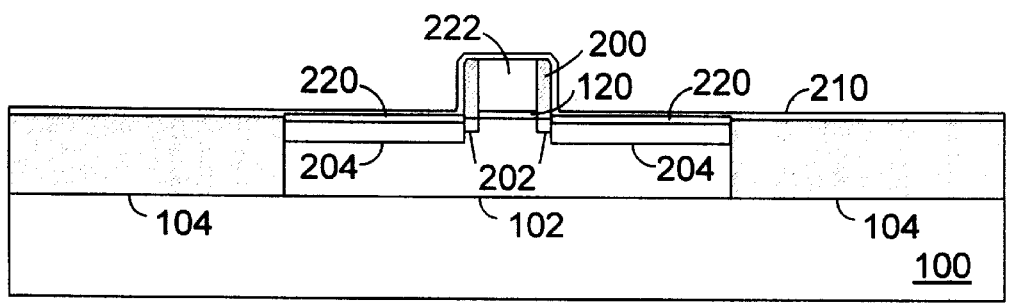

Referring now to FIG. 2C, it may be seen that silicide layers 220 have been formed upon source and drain regions 204. Once the silicidation metal layer 210 was been formed on top of substrate 100, the substrate 100 was subjected to a rapid thermal annealing (RTA) step at a temperature in the range of 600 to 800 degrees Celsius for a period of 30 to 60 second in a pure nitrogen environment. This RTA step not only reacted the silicidation metal layer 210 with a surface portion of the source and drain regions 204 to form the silicide layers 220 but also completed the consumption of the polysilicon gate conductor 122 by the polysilicon consumption metal layer portion 124 to convert the polysilicon gate conductor 122 to a silicide gate conductor 222. Subsequently, the remaining portion of the silicidation metal layer 210 is stripped in an RCA step to expose the source and drain silicide layers 222. The well-known RCA step may employ a wet solution with a 7:1:1 mixture of $H_2O$, $H_2O_2$ and $H_2SO_4$, respectively.

Figure 2D:
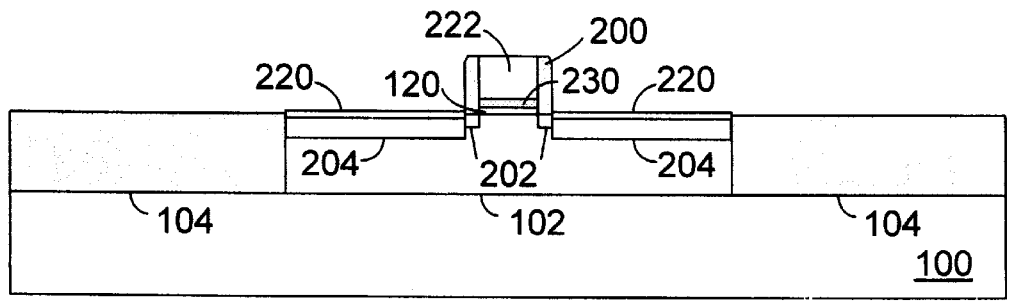

Referring now to FIG. 2D, substrate 100 may be seen after the unreacted metal layer 210 has been stripped away as described above but in an alternate embodiment in which not all of gate conductor 122 is consumed by the silicidation metals. Layer 230 in the gate stack 128 represents the unconsumed layer of the polysilicon gate conductor 122. The portion of the gate conductor that has been consumed by silicidation metal layers 124 and 210 in the annealing step is illustrated as layer 222 within the gate stack 128.

Figure 3:
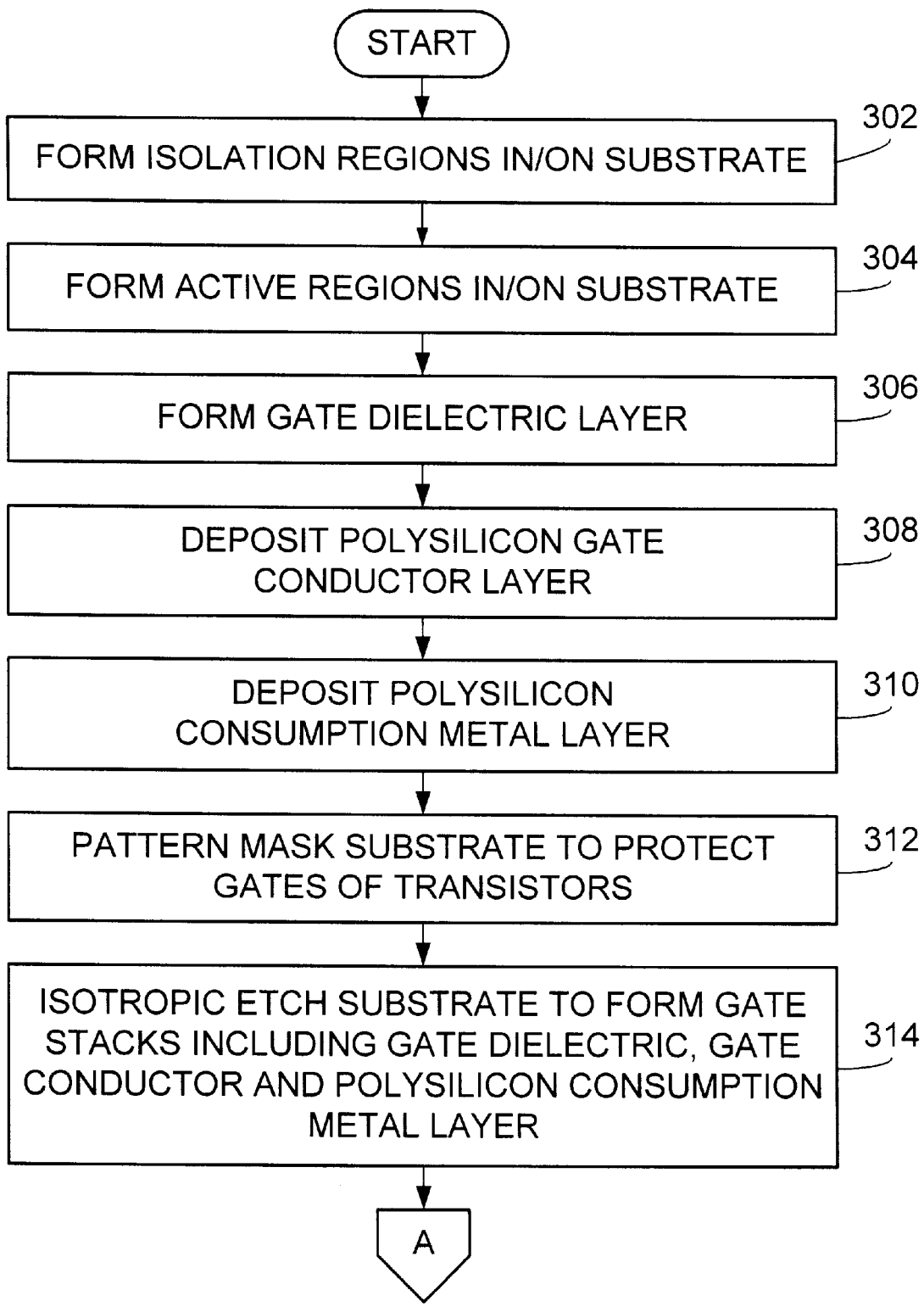
FIG. 3 is a flow chart illustrating a first series of steps according to the present invention employed to form an integrated circuit including transistors with low bulk resistivity gate conductors.

FIG. 3 is a flow chart illustrating a first series of steps according to the present invention employed to form an integrated circuit including transistors with low resistivity gate conductors. Referring now to FIG. 3, isolation regions 104 are formed of an insulating material in/on the substrate 100 (step 302). These isolation regions isolate active devices or conductive components from other active devices or conductive components. The isolation regions 104 may be formed using well-known processes as known by those skilled in the art. Thereafter, active regions 102 are formed in/on substrate 100 (step 304).

Once the active and isolation regions 102 and 104, respectively, are formed within or upon substrate 100, a gate dielectric layer 110 is formed upon the substrate 100 (step 306). In the described embodiment of the invention, the gate dielectric layer 110 is formed of a high K material. However, in other embodiments, the gate dielectric layer 110 may be formed of other materials, such as silicon dioxide. By way of example, the high K material dielectric layer 110 is formed of $Ta_2O_5$ or of barium strontium titanate (BST) in the preferred embodiment of the invention. Thereafter, a polysilicon gate conductor layer 112 is deposited on top of the high K material dielectric layer 110 (step 308). Once the polysilicon gate conductor layer 112 is deposited on top of the dielectric layer 110, a polysilicon consumption metal layer 114 is deposited upon the polysilicon gate conductor layer 112 (step 310). Then, a patterned mask 116 is formed upon substrate 100 to define gate stack 128 structures (step 312). Finally, the gate stack 128 structures are formed in an isotropic etch step wherein unprotected portions of the polysilicon consumption metal layer 114, the gate conductor layer 112, and the gate dielectric layer 110 are removed (step 314).

Figure 4:
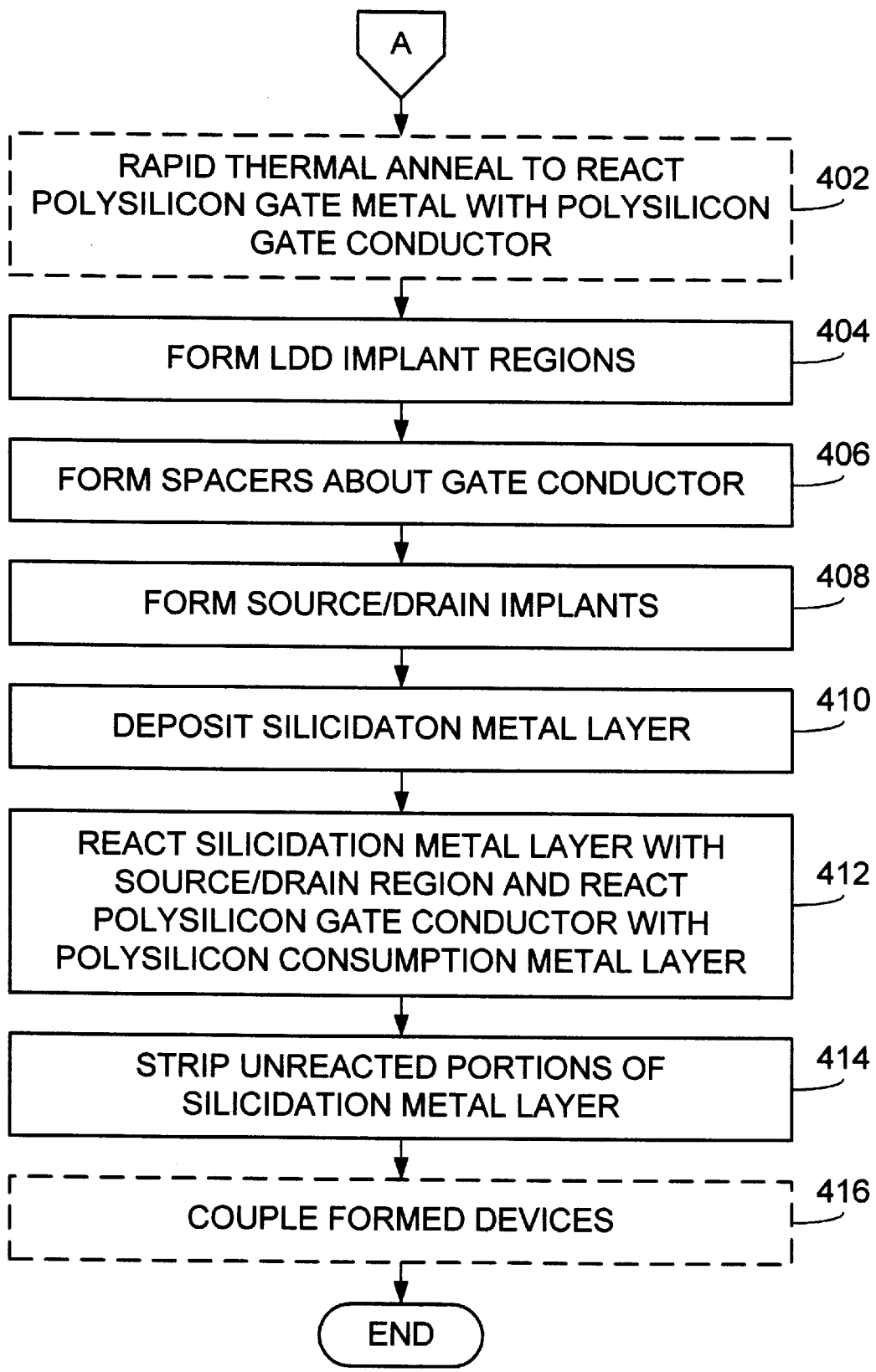
FIG. 4 is a flow chart illustrating a second series of steps according to the present invention employed to form an integrated circuit including transistors with low bulk resistivity gate conductors.

FIG. 4 is a flow chart illustrating a second series of steps according to the present invention employed to form an integrated circuit including transistors with low resistivity gate conductors. Referring now to FIG. 4, the process of forming MOS devices as described in FIG. 3 is continued with an optional rapid thermal annealing (RTA) step to partially react the polysilicon gate metal with the polysilicon gate conductor (step 402). This optional rapid thermal annealing step is performed in a nitrogen environment at a temperature of 600 to 800 degrees Celsius for a period of 30 to 60 seconds. This optional RTA serves to partially react polysilicon consumption metal layer portion 124 with polysilicon gate conductor 122 to convert a portion of the polysilicon gate conductor 122 to a silicide.

After the gate stack 128 is formed, and after the optional RTA step (if it is performed), LDD implant regions 130 are formed in the active regions 102 of substrate 100 (step 404). It is understood, of course, that the doping that is used to form the LDD regions affects only the portions of the active regions 102 that are not under the patterned mask 116. After the LDD regions are implanted, the patterned mask 116 is removed. Alternatively, the LDD regions 130 may be formed after the patterned mask 116 is removed. In such case, the dopant is implanted into the gate stack 128 at a depth commensurate with the implant energy employed. As was previously described, the type of dopant (e.g., arsenic or boron) employed to form the LDD regions 130 depends upon what type of device is being formed (e.g., n-type or p-type, respectively).

Subsequently, spacers 200 are formed about the gate stack 128 (step 406) and source and drain implants 204 are formed within the active regions 102 (step 408). All known process steps for forming the LDD implants, the spacers and the source and drain regions may be used and are specifically included herein for all purposes.

As was discussed previously, a polysilicon consumption metal layer 114 was formed on top of the gate conductor of the gate stack. Now, a silicidation metal layer 210 is formed upon substrate 100 (step 410). After the silicidation metal layer 210 is formed upon substrate 100, it is reacted with the source and drain regions 204 and, along with the polysilicon gate consumption metal layer, it is also reacted with the gate polysilicon conductor 122 (step 412). Thereafter, the unreacted portions of the Silicidation metal layer 210 that remain on top of the source and drain regions of the MOS devices are stripped or removed using known processes (step 414). Finally, the formation of the MOS devices is complete. Accordingly, at least some of the formed devices are coupled to form the integrated circuit or a portion thereof (step 416).

Figure 5:
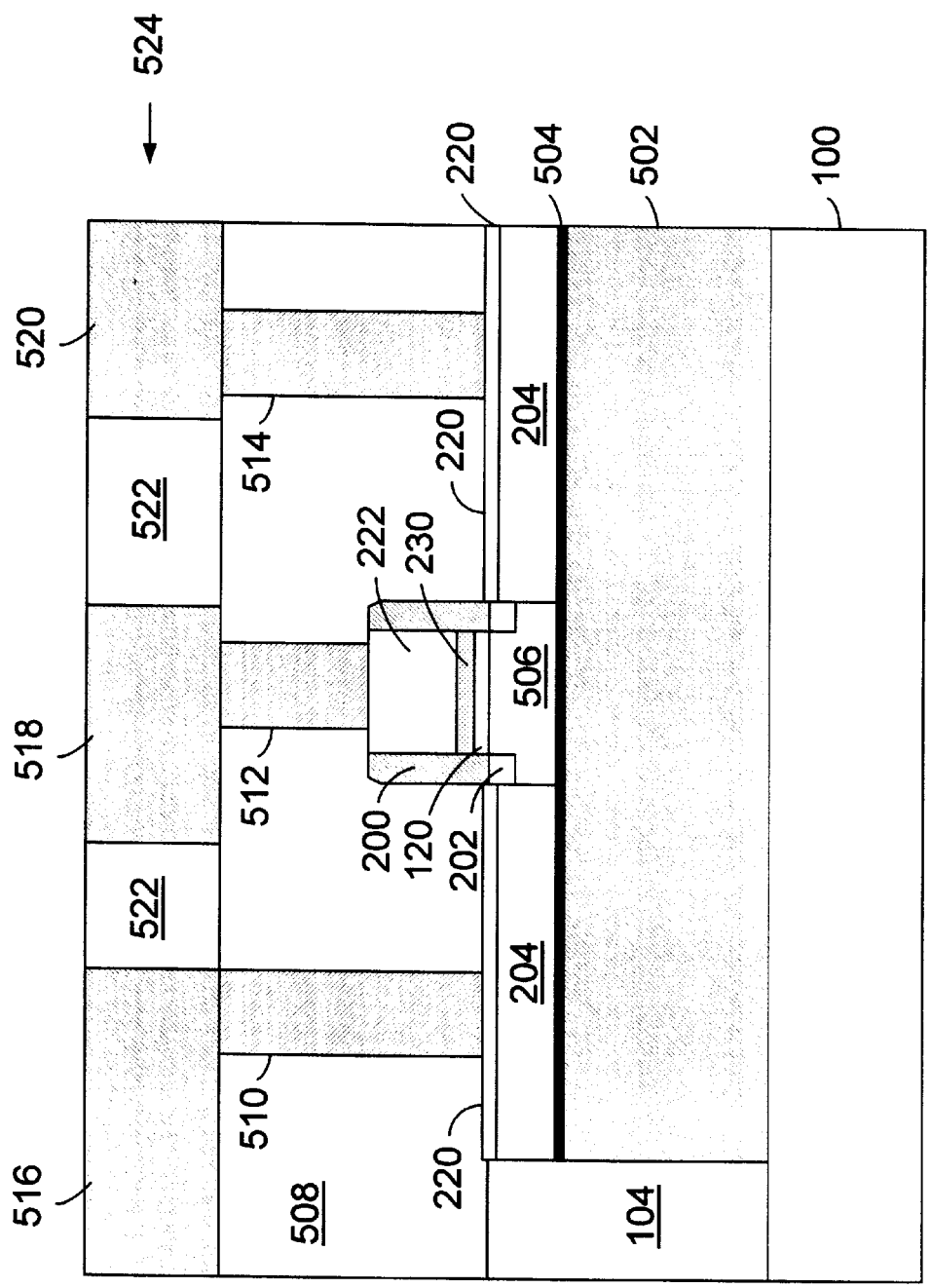
FIG. 5 is a partial cross sectional diagram of a transistor that has been according to the present invention that illustrates the components of the transistor and how the transistor can be connected to other transistors to form an integrated circuit.

FIG. 5 is a partial cross sectional diagram of a transistor that has been formed according to the present invention and that illustrates how the transistor can be connected to other transistors to form an integrated circuit. Referring now to FIG. 5, a well 502 and a punchthrough region 504 have been formed within substrate 100. FIG. 5 also illustrates the LDD implants 202 that were formed as described in step 404 of FIG. 4 as well as the source drain implants 204 of the transistor after being formed as discussed in relation to step 408 of FIG. 4. Also as may be seen, a channel region 506 is formed between the source and drain implants 204. FIG. 5 also illustrates the silicidation layer 220 formed upon the source and drain regions 204 and the consumed polysilicon gate conductor 222. FIG. 5 also illustrates the unconsumed gate conductor layer 230 that exists in an alternate embodiment of the invention. In the other described embodiment of the invention, layer 230 does not exist and layer 222 (comprising the consumed polysilicon) extends to the gate dielectric layer 120.

FIG. 5 also illustrates an insulation layer 508 which is formed to isolate active devices from a metallization layer 524 that is used to interconnect active devices. While only a single active device is shown, literally millions of active devices are typically formed in an integrated circuit, some or all of the active devices formed according to the present invention. As known in the art, insulation layer 508 may be formed in a plurality of different ways. In one embodiment of the invention, the insulation layer 508 is formed in a CVD process to thickness that is required to isolate the metallization layer 524 from the active devices of the integrated circuit. Typically, the insulation layer 508 is polished in a CMP process to form a planar upper surface. It is then masked and etched to form openings to the active regions (e.g., source and drain implants 204 and gate conductor 222) of the device.

Once the openings are formed, a sputtering or evaporation process, by way of example, is used to fill the vias' with a metal. The resulting metallized vias 510, 512 and 514 result. Metals that can be used in this process include Ti, TiN, W and Al. Alternatively, the metallization layer 524 may also be deposited.

Once metallization layer 524 is added, it is masked to form a conductor pattern and the surface is etched back to the insulation layer 508 to form the conductors 516, 518 and 520. An insulator layer 522 may be formed to isolate conductive paths 516, 518 and 520 formed in the metallization layer 524, particularly if a subsequent metallization layer is formed upon the metallization layer 524. Subsequent metallization layers (not shown) can provide further interconnections between the devices and external to the formed integrated circuit. Further, the transistor is interconnected with other active devices by way of these metallization layer(s) to other devices to form an integrated circuit as described in step 416 of FIG. 4.

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

We claim:

1. A method for forming a transistor in an active region of a substrate, comprising:

forming a dielectric layer upon the substrate;

forming a polysilicon gate conductor layer upon the dielectric layer forming a polysilicon consumption metal layer upon the polysilicon gate conductor layer;

forming a patterned mask upon the polysilicon consumption metal layer;

etching portions of the polysilicon consumption metal layer, the polysilicon gate conductor layer and the dielectric layer unprotected by the patterned mask to form a gate stack on the active region, the gate stack including a gate dielectric residing upon the substrate, a polysilicon gate conductor residing upon the gate dielectric and a polysilicon consumption metal layer portion residing upon the polysilicon gate conductor;

forming spacers about the gate stack;

doping portions of the active region adjacent to the gate stack to form source and drain regions;

depositing a silicidation metal layer across substrate, wherein the silicidation metal layer resides upon the polysilicon consumption metal layer portion of the gate stack, upon the spacers, and upon the source and drain regions; and reacting the silicidation metal layer and the polysilicon consumption metal layer portion of the gate stack with the polysilicon gate conductor to form a high conductivity gate conductor while simultaneously reacting the silicidation metal layer with the source and drain regions to form source and drain silicide regions.

2. The method of claim 1, wherein the polysilicon consumption metal layer comprises titanium.

3. The method of claim 1, wherein the polysilicon consumption metal layer comprises cobalt.

4. The method of claim 1, wherein reacting the silicidation metal layer and the polysilicon consumption metal layer portion of the gate stack with the polysilicon gate conductor to form a high conductivity gate conductor while simultaneously reacting the silicidation metal layer with the source and drain regions to form source and drain silicide regions is performed in a rapid thermal annealing step.

5. The method of claim 1, wherein reacting the polysilicon gate conductor layer portion with the polysilicon gate conductor to form the high conductivity gate conductor converts a substantial portion of the polysilicon gate conductor into a silicide.

6. The method of claim 1, wherein reacting the polysilicon gate conductor layer portion with the polysilicon gate conductor to form the high conductivity gate conductor converts all of the polysilicon gate conductor into a silicide.

7. The method of claim 1, further comprising forming lightly doped drain regions.

8. The method of claim 1, further comprising, prior to forming the spacers, reacting the polysilicon consumption metal layer portion with the polysilicon gate conductor to convert at least a portion of the polysilicon gate conductor to a silicide.

9. A method for forming an integrated circuit upon a substrate, comprising:

forming a plurality of transistors by:
    forming a plurality of active regions in the substrate;
    forming a plurality of isolation regions in the substrate that isolate the active regions from one another;
    forming a dielectric layer upon the substrate;
    forming a polysilicon gate conductor layer upon the dielectric layer
    forming a polysilicon consumption metal layer upon the polysilicon gate conductor layer;
    forming a patterned mask upon the polysilicon consumption metal layer;
    etching portions of the polysilicon consumption metal layer, the polysilicon gate conductor layer and the dielectric layer unprotected by the patterned mask to form a plurality of gate stacks on the active region, each gate stack including a gate dielectric residing upon the substrate, a polysilicon gate conductor residing upon the gate dielectric and a polysilicon consumption metal layer portion residing upon the polysilicon gate conductor;
    forming spacers about the gate stacks;
    doping portions of the active regions opposite the gate stacks to form source and drain regions;
    depositing a silicidation metal layer across the substrate, wherein the silicidation metal layer resides upon the polysilicon consumption metal layer portions of the gate stacks, upon the spacers, and upon the source and drain regions;
    reacting the silicidation metal layer and the polysilicon consumption metal layer portion of the gate stacks with the polysilicon gate conductors to form high conductivity gate conductors while simultaneously reacting the silicidation metal layer with the source and drain regions to form source and drain silicide regions; and interconnecting the plurality of transistors.

10. The method of claim 9, wherein the polysilicon consumption metal layer comprises titanium.

11. The method of claim 9, wherein the polysilicon consumption metal layer comprises cobalt.

12. The method of claim 9, wherein reacting the silicidation metal layer and the polysilicon consumption metal layer portions of the gate stacks with the polysilicon gate conductors to form high conductivity gate conductors while simultaneously reacting the silicidation metal layer with the source and drain regions to form source and drain silicide regions is performed in a rapid thermal annealing step.

13. The method of claim 9, wherein reacting the polysilicon gate conductor layer portions with the polysilicon gate conductors to form the high conductivity gate conductors converts substantial portions of the polysilicon gate conductors into silicide.

14. The method of claim 9, wherein reacting the polysilicon gate conductor layer portions with the polysilicon gate conductors to form the high conductivity gate conductors converts all of the polysilicon gate conductors into silicide.

15. The method of claim 9, further comprising forming lightly doped drain regions.

16. The method of claim 9, further comprising, prior to forming the spacers, reacting the polysilicon consumption metal layer portions with the polysilicon gate conductors to convert at least a portion of the polysilicon gate conductors to silicide.

* * * * *